United States Patent [19]
Nishikigi et al.

[11] Patent Number: 5,871,366
[45] Date of Patent: Feb. 16, 1999

[54] ROTARY CONNECTOR

[75] Inventors: Kenichiro Nishikigi; Yoshiro Honda; Nobuo Matsuzaki; Hideshi Sasaki, all of Miyagi-ken, Japan

[73] Assignee: Alps Electric Co., Ltd., Tokyo, Japan

[21] Appl. No.: 839,009

[22] Filed: Apr. 23, 1997

[30] Foreign Application Priority Data

Apr. 26, 1996 [JP] Japan .................................. 8-107664

[51] Int. Cl.$^6$ ................................................. H01R 35/04
[52] U.S. Cl. ............................................. 439/164; 439/15
[58] Field of Search ...................................... 439/164, 15

[56] References Cited

U.S. PATENT DOCUMENTS

| 4,722,690 | 2/1988 | Priede ...................................... 439/15 |
| 5,257,943 | 11/1993 | Ueno et al. ............................. 439/164 |
| 5,662,486 | 9/1997 | Kato et al. ............................... 439/15 |

*Primary Examiner*—Gary F. Paumen
*Attorney, Agent, or Firm*—Brinks Hofer Gilson & Lione

[57] ABSTRACT

A rotary connector including a stationary housing, a rotating housing and a lock member. When the lock member is mounted on the rotary connector, both housings are reliably locked with no free rotation therebetween permitted. The lock member is easily broken at a thin portion to release the locked state. A holder having a slot is integrally formed with the outer cylindrical portion of the stationary housing, while a projection is formed on the top surface of the rotating housing. The lock member is integrally formed of a horizontally extending arm portion, a ring-shaped finger-hook portion integrally connected to one end of the arm portion, and a coupling portion that extends downward from the other end of the arm portion. Formed on the border between the arm portion and the coupling portion is a V-shaped groove, as the thin portion, which is mechanically weaker than the rest of the lock member. The coupling portion of the lock member is snapped in the slot while the hole formed in the arm portion receives the projection of the rotating housing, and thus a relative rotation between both housings is blocked. By pivoting upward the finger-hook portion and the arm portion about the thin portion as a fulcrum, the arm portion is broken at the thin portion away from the coupling portion, and the coupling portion remains snapped in the slot.

15 Claims, 4 Drawing Sheets

ROTARY CONNECTOR

BACKGROUND OF THE INVENTION

1. Field of the Invention

The present invention relates to a rotary connector which establishes electrical connection using a flexible cable between a pair of housings coupled in a relatively rotational relation and, more specifically, to a lock mechanism for use in the rotary connector, for retaining both housings in their neutral rotational position until the rotary connector is mounted on the steering device of a vehicle.

2. Description of the Related Art

Some rotary connectors comprise a pair of rotating and stationary housings coupled in a relatively rotational relation, and a flexible cable coiled within an annular container defined between both housings, with both ends of the flexible cable supported respectively at both housings to be connected to external electrical connections. As the rotating housing rotates relative to the stationary housing, the flexible cable is coiled tightly or loosely within the container depending on the rotation direction of the rotating housing. In either movement, electrical connection between both housings is maintained via the flexible cable.

The rotary connector thus constructed is used as electrical connection means for an air bag inflator, a horn switch and the like, with the stationary housing mounted on a combination switch as a stator member of a steering device while the rotating housing mounted on a steering wheel as a rotor member of the steering device. The rotary connector is required to rotate in a balanced fashion from the neutral rotational position of the steering wheel with a range of travel in clockwise rotation and a range of travel in counterclockwise rotation being equal. For this reason, a known rotary connector is typically provided with a lock mechanism which retains both housings in the neutral position until the rotary connector is mounted onto the steering device.

One of known rotary connectors with a lock mechanism is a lock member of a synthetic resin into which a coupling portion, a finger-hook portion and a key portion are integrally formed, wherein a thin portion is formed between the coupling portion and the finger-hook portion. Using the lock member, the relative rotation of one housing to the other housing is blocked. More particularly, with both housings positioned at the neutral position, the coupling portion of the lock member is engaged with a coupling hole of one housing while the key portion is engaged with a rotation restraint portion of the other housing, and thus the free rotation of one housing to the other is restrained. Such a locked state is continuously maintained until the mounting of the rotary connector onto the steering device. When the rotary connector is mounted on the steering device, the finger-hook portion is drawn using a finger or a tool and then the finger-hook portion and the key portion are broken at the thin portion away from the coupling portion. The locked state of the housings by means of the lock member is thus released. In this unlocked state, the coupling portion broken at the thin portion remains in the coupling hole, and thus an unintentional removal of the lock member can be checked by the presence of the coupling portion.

In such a conventional rotary connector, the finger-hook portion and the coupling portion are arranged with the thin portion therebetween, generally in a line in alignment with the direction of drawing of the finger-hook portion. If the thin portion is designed to be mechanically too weak, it will be easily and possibly unintentionally ruptured in the locked state by an external force acting on the lock member and the housings. If the thin portion is designed to be strong enough to reliably maintain the locked state, the lock member is difficult to rupture when the releasing of the locked state is actually needed.

SUMMARY OF THE INVENTION

Accordingly, it is an object of the present invention to provide a rotary connector which prevents a pair of first and second housings from rotating relative to each other in a locked state. A lock member is integrally formed of an arm portion, a finger-hook portion continuously extending from one end of the arm portion, and a coupling portion extending from the other end of the arm portion in a direction approximately perpendicular to the length of the arm portion with a thin portion arranged between the coupling portion and the other end of the arm portion. To keep the housings in the locked state, the coupling portion of the lock member is held at the locking portion of the first housing and the arm portion of the lock member is engaged with the rotation restraint portion of the second housing. In the arrangement that the arm portion which extends in substantially perpendicular to the coupling portion is formed between the finger-hook portion and the coupling portion, the arm portion is pivoted about the thin portion on the principle of levers, when the finger-hook portion is drawn to release the locked state, and thus the arm portion is easily broken away from the coupling portion, which remains held onto the locking portion of the first housing.

The locking portion may be a slot, for example, formed in the first housing. The coupling portion of the lock member is a snap piece that is snapped into the slot.

The rotation restraint portion may be a projection, for example, formed in the second housing. The arm portion of the lock member is provided with a hole into which the projection is inserted. Conversely, the second housing may be provided with a hole, as the rotation restraint portion, into which a projection formed in the arm portion of the lock member may be inserted.

If a V-shaped groove is formed in the vicinity of the thin portion, the arm portion will be easily broken away from the coupling portion without weakening the mechanical strength of the thin portion.

One of the housings is a stationary part and the other of the housings is a rotating part. If the first housing is a stationary part and the second housing is a rotating part, and the coupling portion is held in the stationary housing during unlocked state. During use of the rotary connector, the coupling portion is prevented from easily coming off and generation of noise arising from a detached coupling portion is avoided.

DESCRIPTION OF THE PREFERRED EMBODIMENTS

Figure 1:
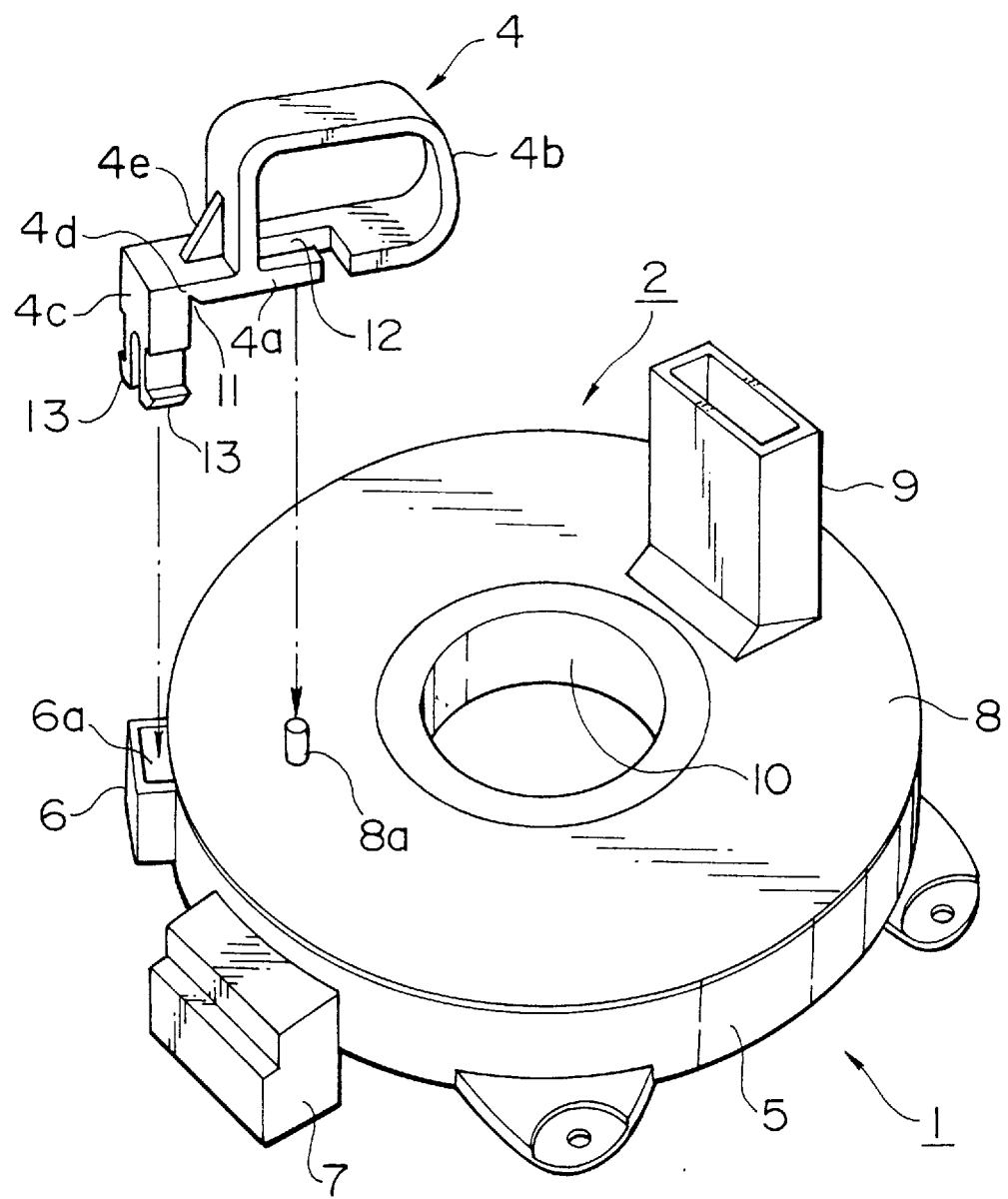
FIG. 1 is a perspective view showing a rotary connector and a lock member according to one embodiment of the present invention.

Referring to the drawings, the embodiments of the present invention are now discussed. As shown in FIG. 1, a rotary connector comprises a stationary housing 1 as a first housing, a rotating housing 2 as a second housing, and a flexible cable 3 coiled within a space defined by the housings 1 and 2 (see FIG. 3). A lock member 4 is detachably mounted onto the rotary connector.

Figure 2:
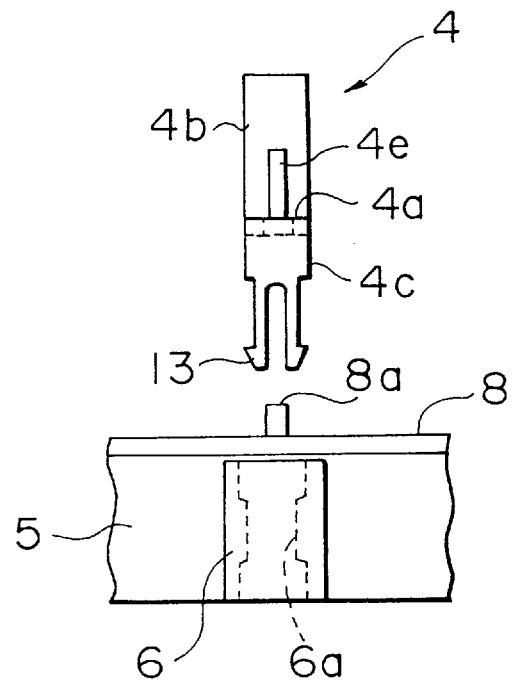
FIG. 2 is an explanatory view showing the mounting operation of the lock member.

The stationary housing 1 of a synthetic resin is of a closed-end structure having a ring-like cylindrical portion 5. A holder 6 and a direct connector 7 are integrally formed with the circumference of the cylindrical portion 5. Referring to FIG. 2, a holder 6 defines a slot 6a, and step portions 6b are formed on the inner walls of the sides of the holder 6. In this embodiment, the holder 6 is of a rectangular tube with both top and bottom ends opened. Alternatively, as long as the top end of the slot 6a is opened, the holder 6 may be closed at its bottom end, or the holder 6 may be of other shape.

Figure 3:
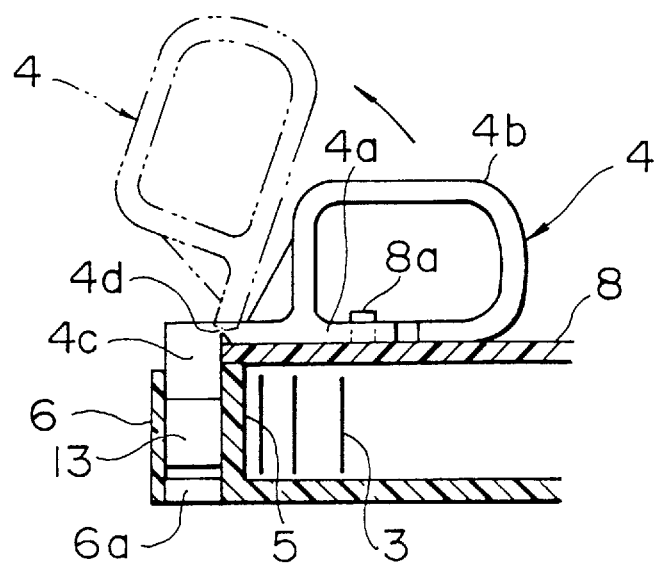
FIG. 3 is a cross-sectional view showing a major portion of the lock member when it is in a locking engagement.

The rotating housing 2 is fabricated of a synthetic resin. The rotating housing 2 is rotatably connected to the stationary housing 1 so that the rotating housing 2 closes the aperture defined by the stationary housing 1. A projection 8a as a rotation restraint portion and a direct connector 9 are integrally formed with the top surface 8 of the rotating housing 2. An inner cylindrical portion 10 is provided in the center of the rotating housing 2. Referring to FIG. 3, the flexible cable 3 is coiled in a spiral fashion, for example, within a ring-shaped container defined by both housings 1 and 2. Both ends of the flexible cable 3 are respectively supported at both housings 1, 2 and then electrically routed outwardly via the direct connectors 7, 9, respectively.

The lock member 4 is integrally formed of a horizontally extending arm portion 4a, a ring-shaped finger-hook portion 4b extending one end of the arm portion 4a and a coupling portion 4c extending vertically downwardly from the other end of the arm portion 4a. The lock member 4 is integrally fabricated of a synthetic resin. The arm portion 4a and the coupling portion 4c are mutually substantially perpendicular, and a V-shaped groove 11 is formed on the border between two portions and constitutes a thin portion 4d. The arm portion 4a is provided with a hole 12, and a reinforcing rib 4e extends from the top surface of the arm portion 4a to the finger-hook portion 4b. The coupling portion 4c is provided with a bifurcated snap piece 13.

The rotary connector thus constructed is used as electrical connection means for an air bag inflator, a horn switch and the like mounted on a steering wheel, with the stationary housing 1 connected to the stator member of a steering device and the rotating housing 2 connected to the steering wheel as the rotor member of the steering device. When the rotary connector is assembled, the rotating housing has to rotate both clockwise and counterclockwise from the neutral rotational position of the steering wheel, wherein a range of travel in clockwise rotation is approximately equal to a range of travel in counterclockwise rotation. To this end, during the manufacturing stage of the rotary connector, the neutral rotational position of the rotating housing 2 is aligned with the stationary housing 1 and then the coupling portion 4c of the lock member 4 is inserted into the slot 6a of the stationary housing 1, as shown in FIGS. 1 and 2. The lock member 4 is fully inserted, and the snap piece 13 of the lock member 4 snaps into the step portions 6b of the holder 6 as shown by a solid-line drawing in FIG. 3 while the projection 8a of the rotating housing 2 is inserted into the hole 12 of the arm portion 4a. As a result, the rotation of the rotating housing 2 is blocked by the lock member 4. During the transit of the rotary connector, the rotating housing 2 is prevented from rotating relative to the stationary housing 1. Such a locked state is maintained until the rotary connector is mounted onto the steering device.

When the rotary connector is assembled into the steering device, the finger-hook portion 4b of the lock member 4 is raised, using a finger or a tool, as shown by a chain line with two dots in FIG. 3, and the lock member 4 is broken away from the rotary connector. The coupling portion 4c remains snapped in the slot 6a of the stationary housing 1. Since the arm portion 4a is formed between the coupling portion 4c and the finger-hook portion 4b, both the finger-hook portion 4b and arm portion 4a are pivoted upward about the thin portion 4d as a fulcrum according to the principle of levers and the lock member 4 is easily ruptured at the thin portion 4d that is relatively mechanically weaker than the rest of the lock member 4. The arm portion 4a is broken at the thin portion 4d away from the coupling portion 4c, and the coupling portion 4c remains snapped in the slot 6a of the stationary housing 1. The finger-hook portion 4b and arm portion 4a of the lock member 4 are thus removed. By visually checking the ruptured state of the coupling portion 4c after unlocking the rotary connector, any once unlocked rotary connector is clearly identified.

Figure 4:
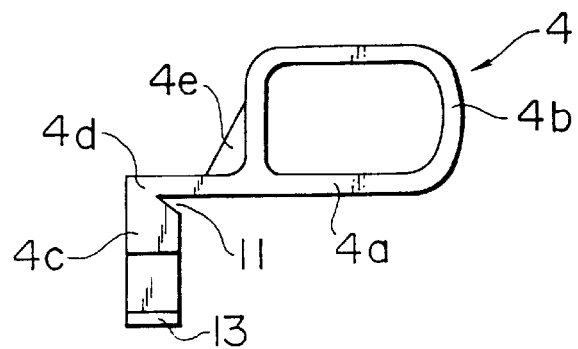
FIG. 4 is a front view showing a modification of the lock member.

In the embodiment shown in FIG. 4, the V-shaped groove 11 as the thin portion 4d is formed in the coupling portion 4c near the board between the other end of the arm portion 4a and the top end of the coupling portion 4c. The V-shaped groove 11 in this embodiment has its depth in a direction at an approximately right angle to the direction of depth of the V-shaped groove of the preceding embodiment.

Figure 5:
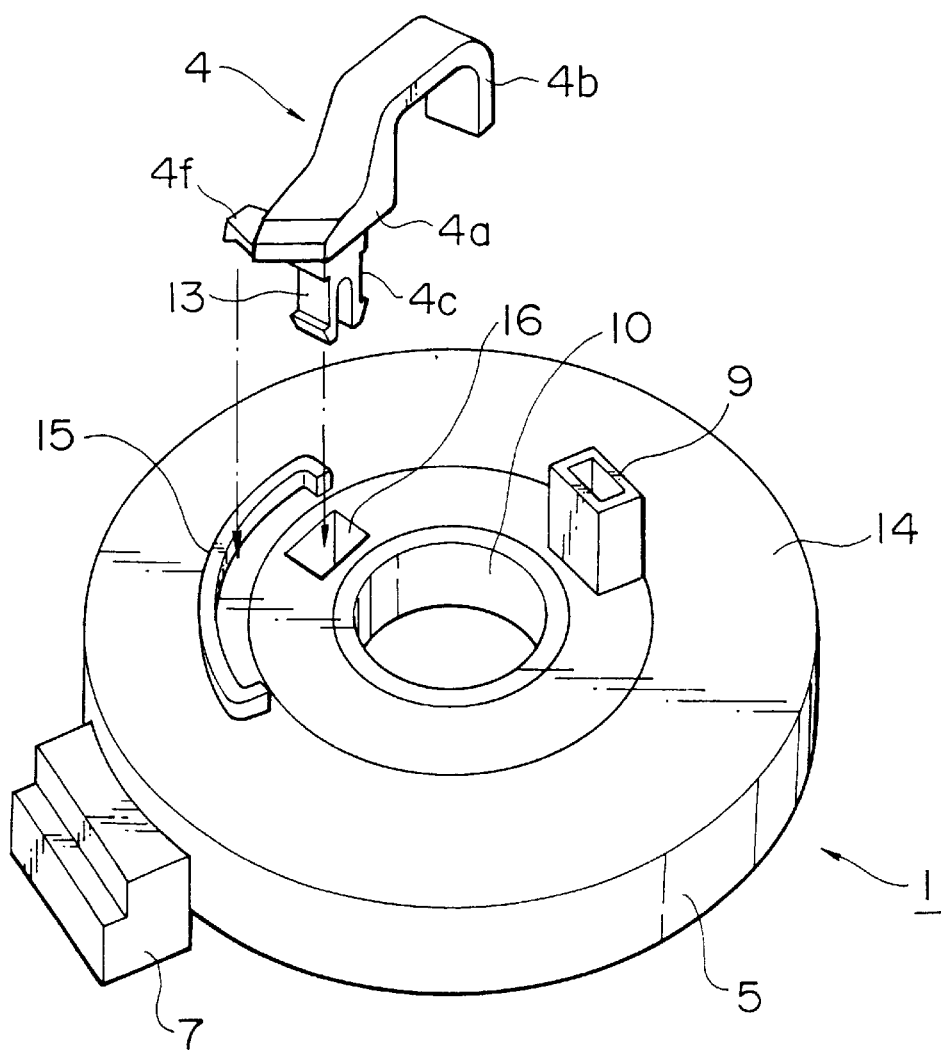
FIG. 5 is a perspective view showing a rotary connector and a lock member according to another embodiment of the present invention.
Figure 6:
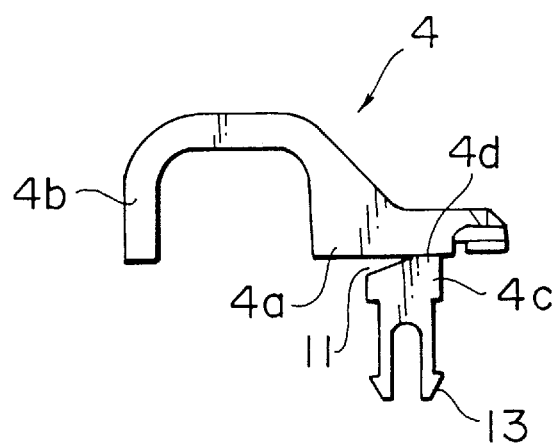
FIG. 6 is a front view showing the lock member of FIG. 5.

In embodiments shown in FIGS. 5 and 6, the relationship between the first and second housings is reversed. A first housing 1 is integrally formed of a cylindrical portion 5, a bottom disk portion (not shown) and a top disk portion 4, and a stopper wall 15 as rotation restraint means is formed on the top disk portion 14. The inner cylindrical portion 10 of a rotatable housing 2 is rotatably supported at the centers of the bottom disk and the top disk 14. A slot 16 as a locking portion is formed on the top side of the inner cylindrical portion 10. The lock member 4 is integrally formed of a horizontally extending arm portion 4a, an inverse-U-shaped finger-hook portion 4b continuously connected to one end of the arm portion 4a, and a coupling portion 4c extending downwardly from the other end of the arm portion 4a, and a key portion 4f is laterally projected from the arm portion 4a.

The rotary connector thus constructed is adjusted to its neutral rotational position with the rotating housing 2 aligned with the stationary housing 1, and the coupling portion 4c of the lock member 4 is then inserted into the slot 16 of the rotating housing 2, during the manufacturing stage of the rotary connector. When the lock member 4 is fully inserted, the snap piece 13 of the lock member 4 is snapped in unshown step portions within the slot 16 while the key portion 4f laterally projecting from the arm portion 4a fits within a space surrounded by the stopper wall 15 of the stationary housing 1. As a result, the rotation of the rotating housing 2 is blocked by the lock member 4. To assemble the rotary connector into a steering device, the finger-hook portion 4b of the lock member 4 is raised using a finger or a tool. The arm portion 4a is broken at the thin portion 4d from the coupling portion 4c. The coupling portion 4c remains snapped in the slot 16 in the rotating housing 2 while the finger-hook portion 4b, arm portion 4a and key portion 4f of the lock member 4 are removed.

The embodiments of the present invention that have been described has the following advantages.

A lock member is integrally formed of an arm portion, a finger-hook portion continuously extending from one end of the arm portion, and a coupling portion extending from the other end of the arm portion in a direction approximately perpendicular to the length of the arm portion with a thin portion arranged between the coupling portion and the other end of the arm portion. The coupling portion of the lock member is engaged with the locking portion of a first housing and the arm portion of the lock member is engaged with the rotation restraint portion of a second housing, and thus the rotation of the first housing relative to the second housing is blocked. When the finger-hook portion is drawn to release the locked state, the arm portion is easily broken away from the coupling portion according to the principle of levers.

Since a V-shaped groove is formed in the vicinity of the thin portion, the arm portion is easily broken away from the coupling portion without weakening the mechanical strength of the thin portion.

Since the first housing is a stationary part and the second housing is a rotatable part, the coupling portion remains in the stationary housing during unlocked state. During use, the coupling portion is prevented from easily coming off and generation of noise arising from a detached coupling portion is avoided.

What is claimed is:

1. A rotary connector comprising a pair of first and second housings which are coupled in a relatively rotatable relation, a flexible cable for establishing electrical connection between both housings, and a lock member which is detachably mounted onto the housings and which blocks a free relative rotation between the housings when the lock member is mounted thereon, wherein the lock member integrally comprising an arm portion, a finger-hook portion continuously extending from one end of the arm portion, and a coupling portion extending from the other end of the arm portion in a direction approximately perpendicular to the length of the arm portion with a thin portion arranged between the coupling portion and the other end of the arm portion, wherein, when the housings are in a locked state with the lock member mounted, the coupling portion of the lock member is held at a locking portion of the first housing and the arm portion of the lock member is engaged with a rotation restraint portion of the second housing, and when the housings are put into an unlocked state to permit a free relative rotation therebetween, the arm portion is broken at the thin portion and away from the coupling portion while the coupling portion remains held at the locking portion of the first housing.

2. A rotary connector according to claim 1, wherein the thin portion is a V-shaped groove formed in the lock member.

3. A rotary connector according to claim 1, wherein the first housing is a stationary part and the second housing is a rotating part.

4. A rotary connector according to claim 2, wherein the first housing is a stationary part and the second housing is a rotating part.

5. A rotary connector according to claim 1, wherein the first housing is a rotating part and the second housing is a stationary part.

6. A rotary connector according to claim 2, wherein the first housing is a rotating part and the second housing is a stationary part.

7. A rotary connector according to claim 1, wherein the lock member has the V-shaped groove, the depth of which is generally parallel to the direction of length of the coupling portion extending from the arm portion.

8. A rotary connector according to claim 2, wherein the lock member has the V-shaped groove, the depth of which is generally parallel to the direction of length of the coupling portion extending from the arm portion.

9. A rotary connector according to claim 1, wherein the lock member has the V-shaped groove, the depth of which is generally perpendicular to the direction of length of the coupling portion extending from the arm portion.

10. A rotary connector according to claim 2, wherein the lock member has the V-shaped groove, the depth of which is generally perpendicular to the direction of length of the coupling portion extending from the arm portion.

11. A rotary connector comprising a pair of first and second housings which are coupled in a relatively rotatable relation, a flexible cable for establishing electrical connection between both housings, and a lock member which is detachably mounted onto the housings and which blocks a free relative rotation between the housings when the lock member is mounted thereon, wherein the lock member integrally comprising an arm portion, a finger-hook portion continuously extending from one end of the arm portion, and a coupling portion extending from the other end of the arm portion in a direction approximately perpendicular to the length of the arm portion with a thin portion of a V-shaped groove arranged between the coupling portion and the other end of the arm portion, wherein, when the housings are in a locked state with the lock member mounted, the coupling portion of the lock member is held at a locking portion of the first housing and the arm portion of the lock member is engaged with a rotation restraint portion of the second housing, and when the housings are put into an unlocked state to permit a free relative rotation therebetween, the arm portion is broken at the thin portion and away from the coupling portion while the coupling portion remains held in the locking portion of the first housing.

12. A rotary connector according to claim 11, wherein the first housing is a stationary part and the second housing is a rotating part.

13. A rotary connector according to claim 11, wherein the first housing is a rotating part and the second housing is a stationary part.

14. A rotary connector according to claim 11, wherein the lock member has the V-shaped groove, the depth of which is generally parallel to the direction of length of the coupling portion extending from the arm portion.

15. A rotary connector according to claim 11, wherein the lock member has the V-shaped groove, the depth of which is generally perpendicular to the direction of length of the coupling portion extending from the arm portion.

* * * * *